United States Patent [19]

Bazes

[11] Patent Number: 4,975,605
[45] Date of Patent: Dec. 4, 1990

[54] SYNCHRONOUS DELAY LINE WITH AUTOMATIC RESET

[75] Inventor: Mel Bazes, Haifa, Israel

[73] Assignee: Intel Corporation, Santa Clara, Calif.

[21] Appl. No.: 434,340

[22] Filed: Nov. 13, 1989

[51] Int. Cl.[5] .................... H03K 5/13; H03K 5/159; H03K 17/28
[52] U.S. Cl. .................................... 307/606; 377/76; 307/602; 307/605; 328/56
[58] Field of Search ............... 307/127, 236, 262, 595, 307/596, 597, 602, 603, 606, 605; 328/55, 56, 11.8; 333/138; 377/76

[56] References Cited

U.S. PATENT DOCUMENTS

| | | | |
|---|---|---|---|
| 4,119,796 | 10/1978 | Jones | 328/56 |
| 4,443,765 | 4/1984 | Findeisen et al. | 377/76 |
| 4,675,562 | 6/1987 | Herlein et al. | 307/602 |

*Primary Examiner*—Stanley D. Miller
*Attorney, Agent, or Firm*—Blakely, Sokoloff, Taylor & Zafman

[57] ABSTRACT

An automatic reset scheme for a synchronized delay line detects the polarity of the tap signals from a predetermined number of delay stages. If the delay line powers up to lock onto one of the non-fundamental modes of operation, an inverted polarity is detected at the output of one of the selected taps coupled to the reset circuit and an automatic reset is initiated for the delay line.

7 Claims, 11 Drawing Sheets

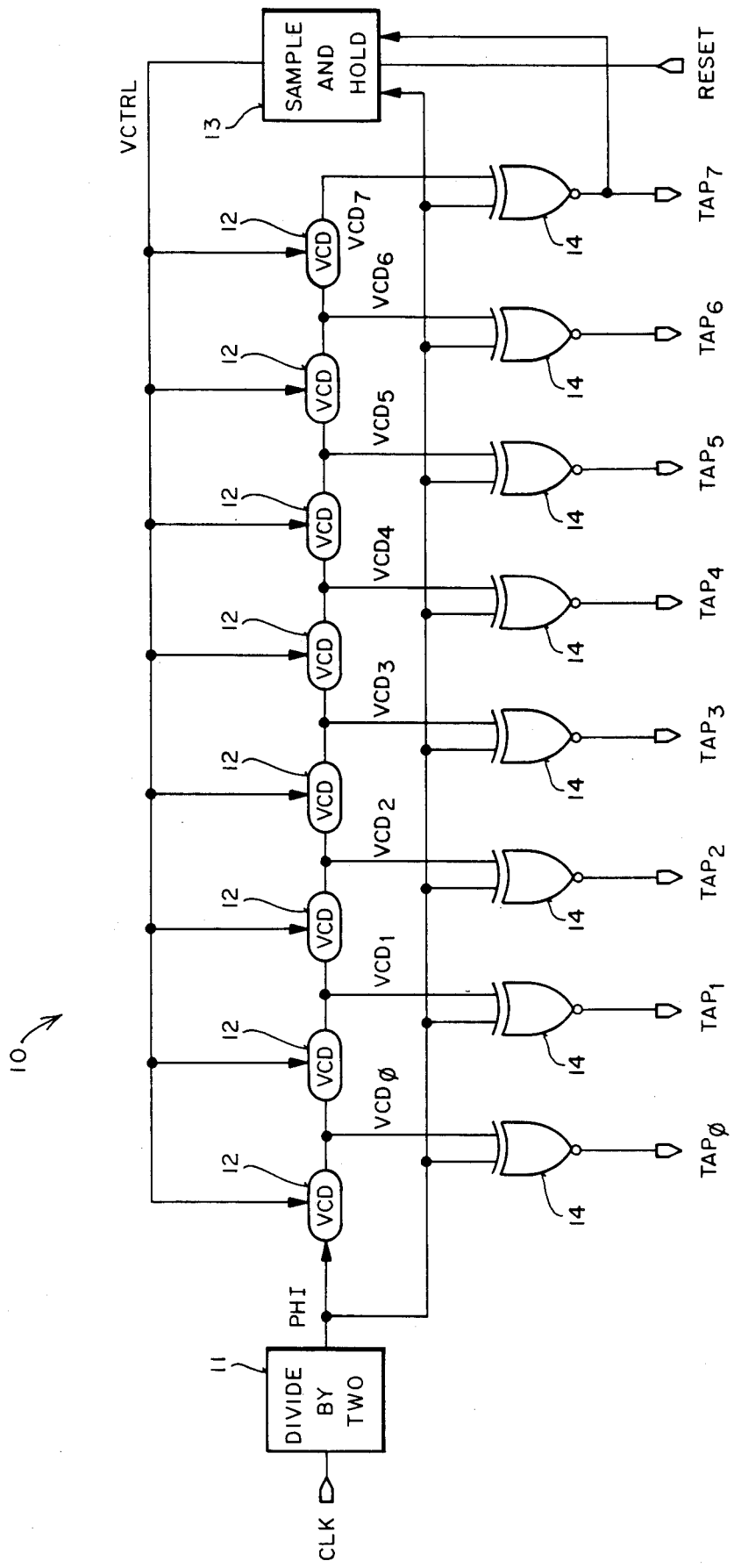
FIG_1 (PRIOR ART)

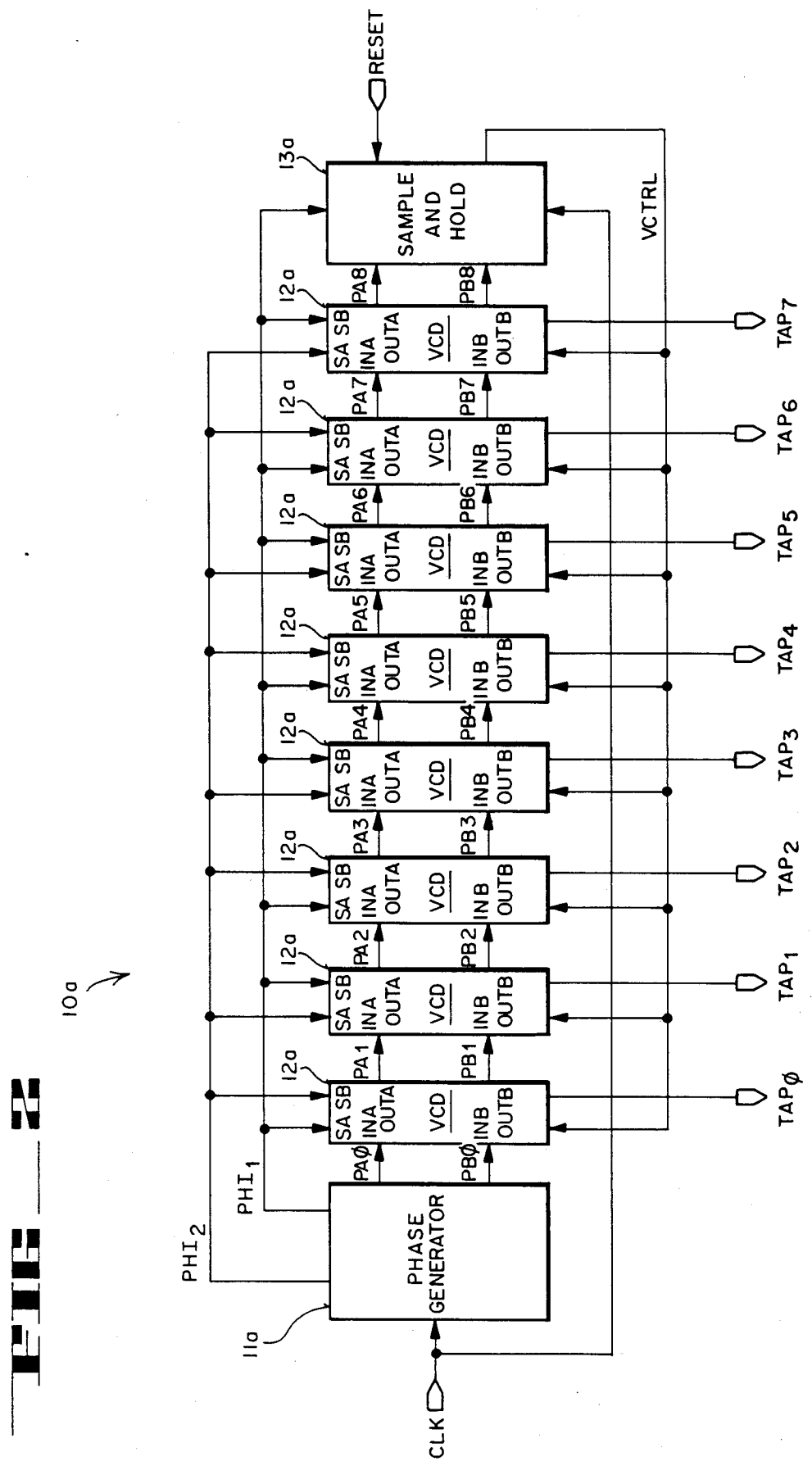

FIG_3
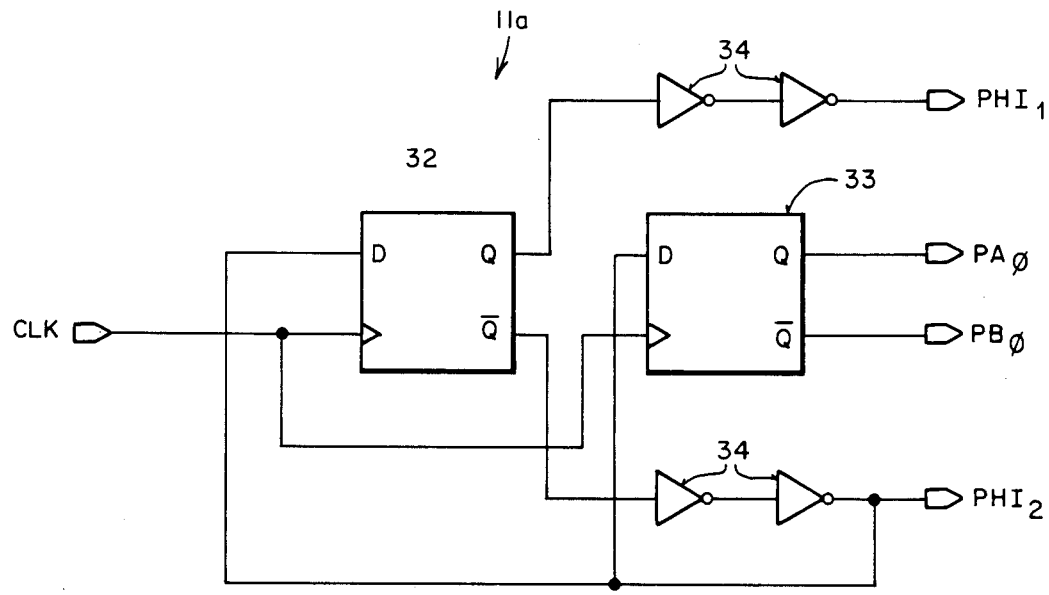
FIG_4
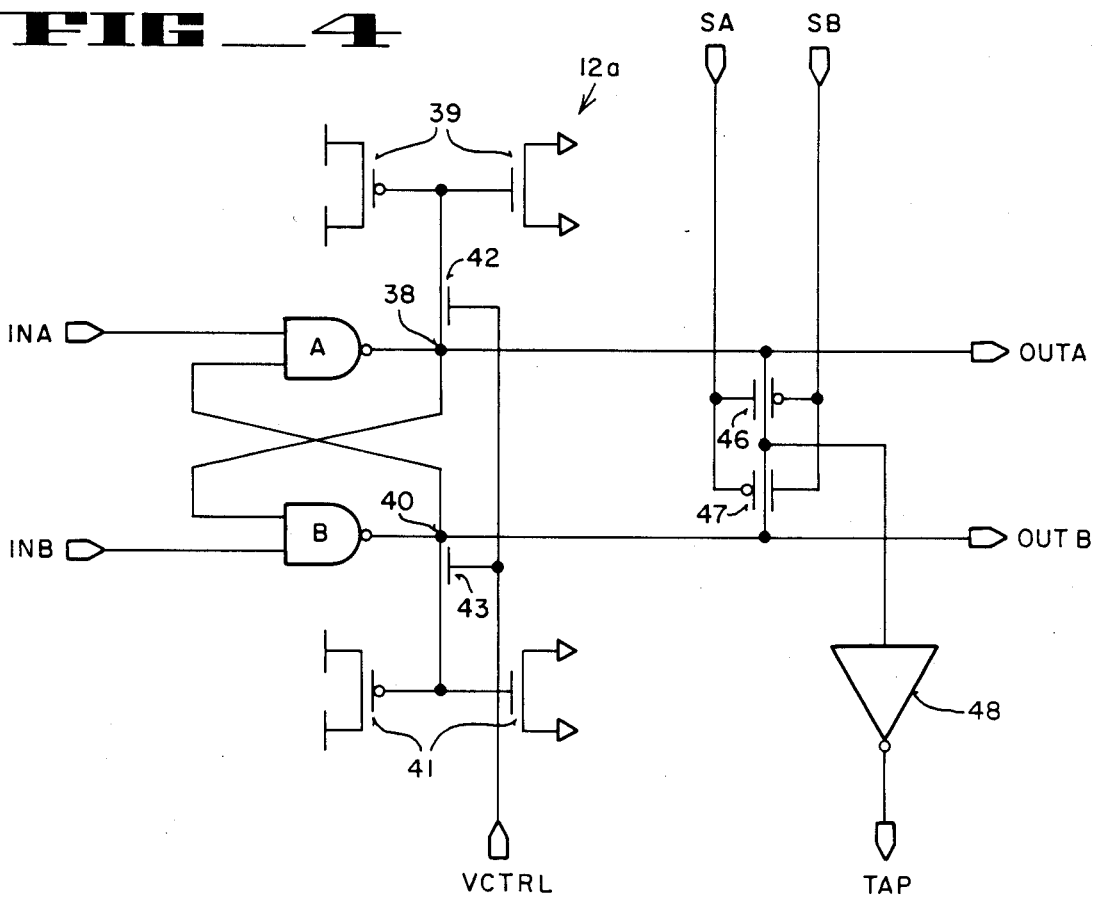

FIG_5
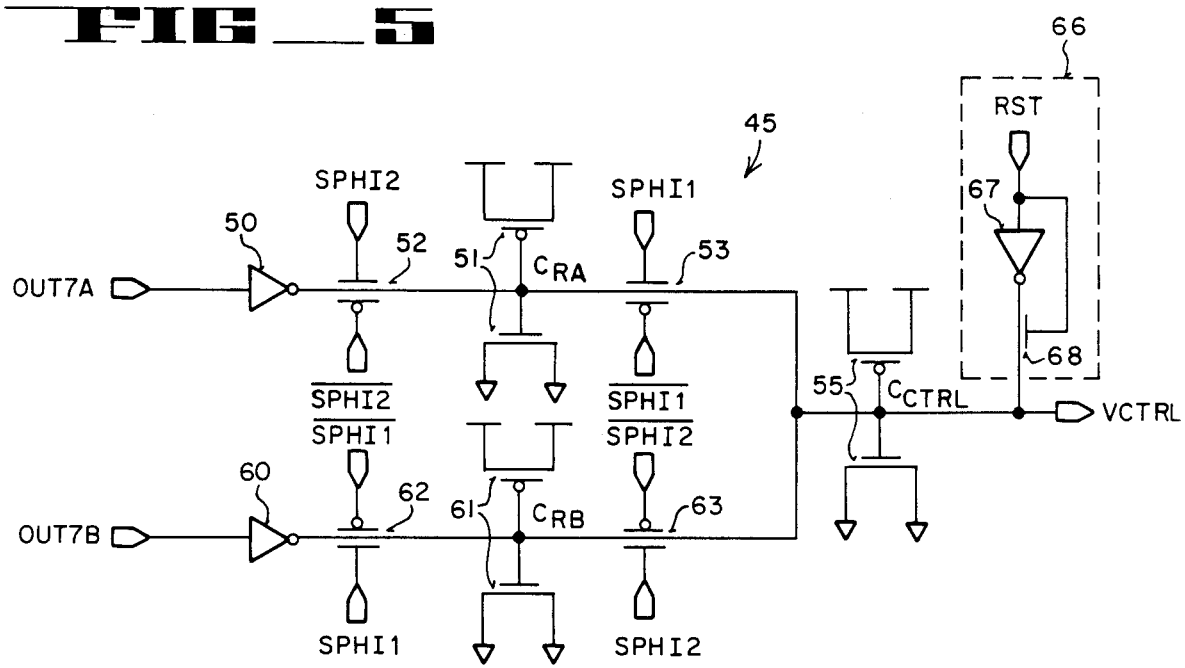
FIG_6
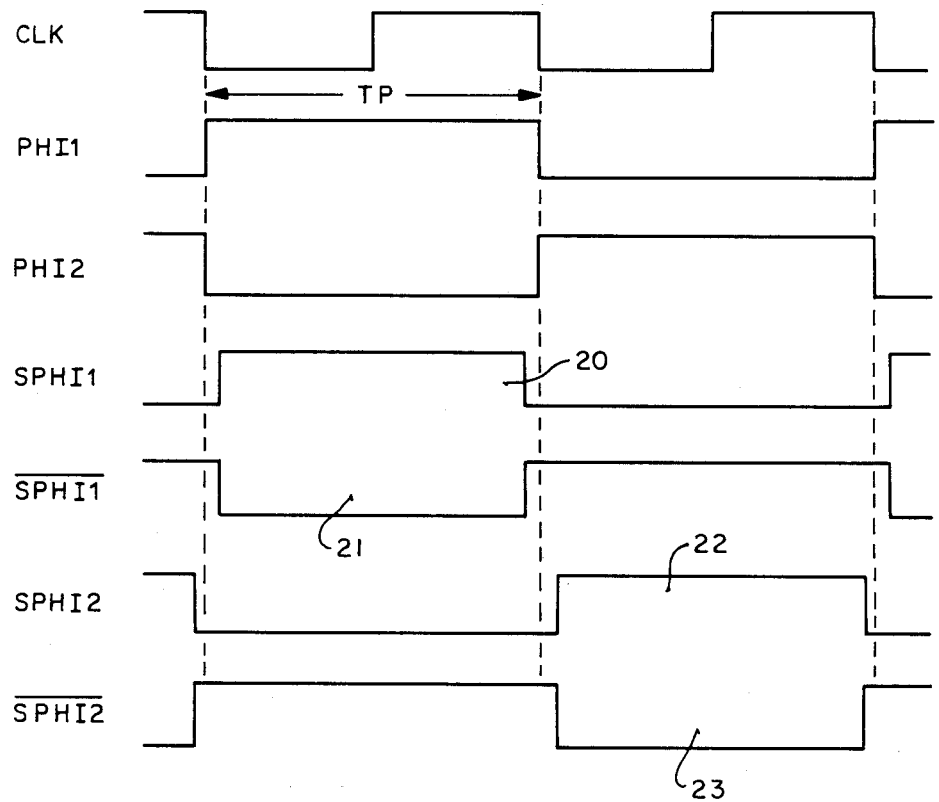

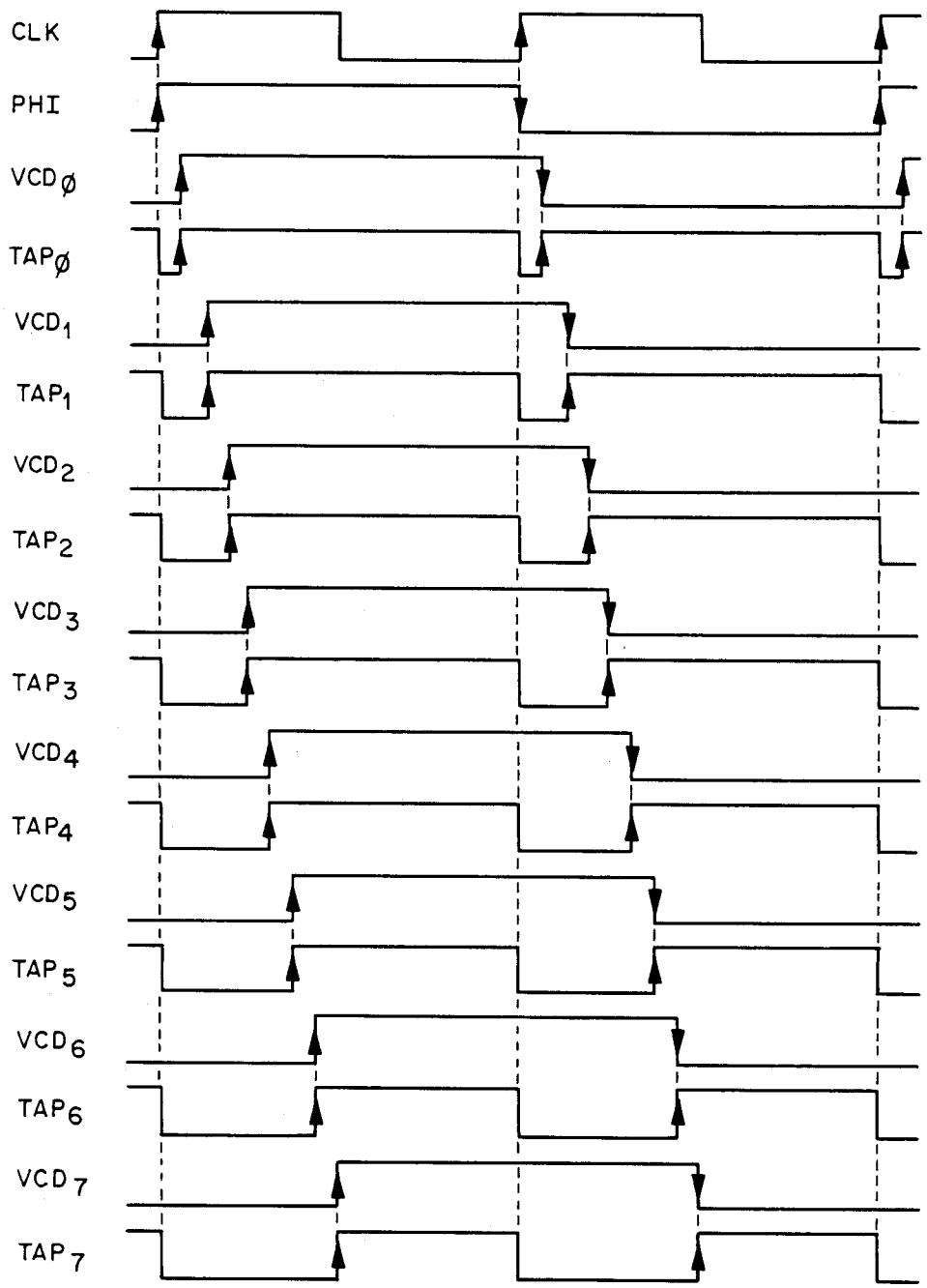
FIG_7
SDL WAVEFORMS FOR TD = TP/2

FIG_8
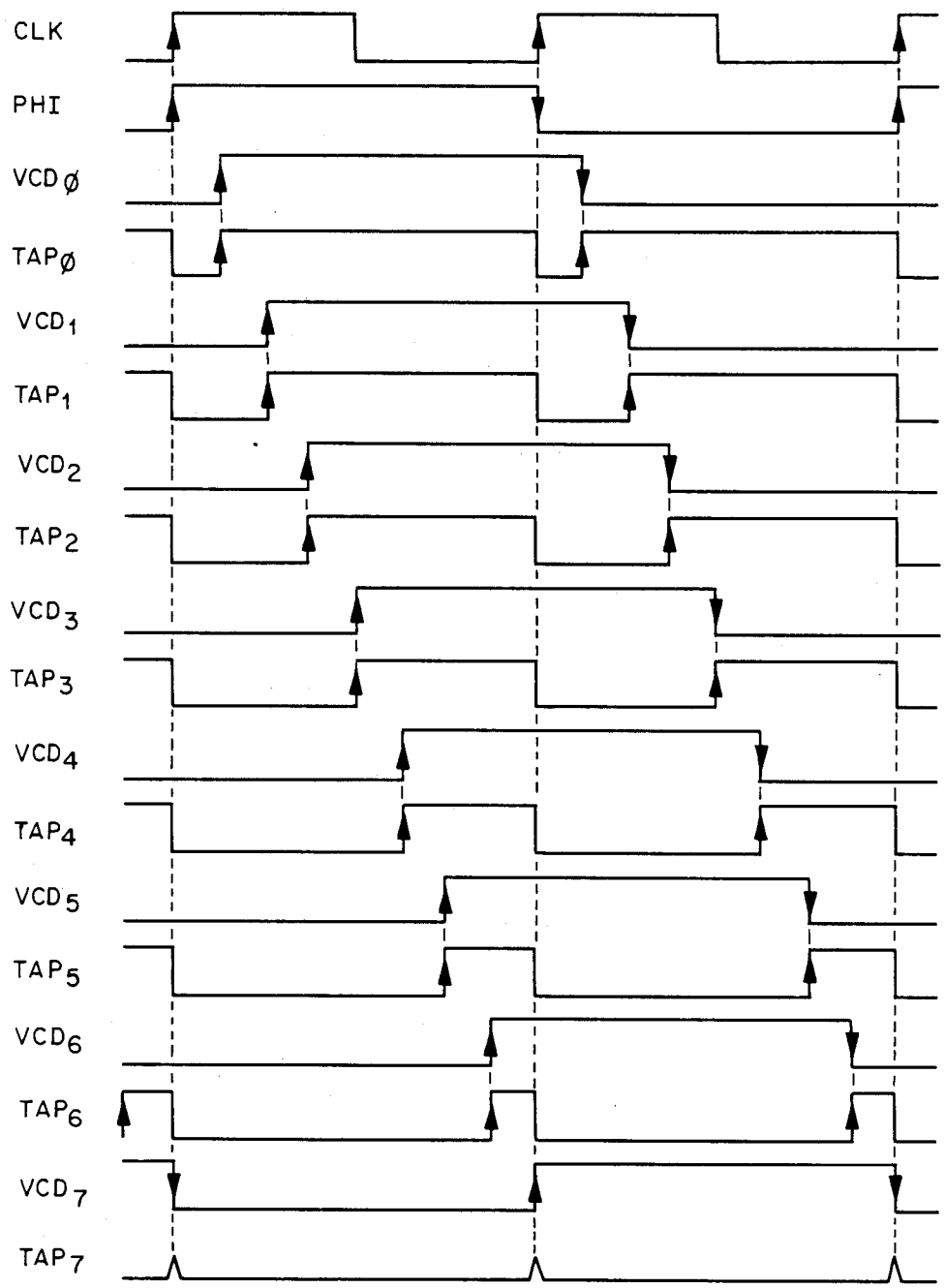
SDL WAVEFORMS FOR TD = TP

FIG_9
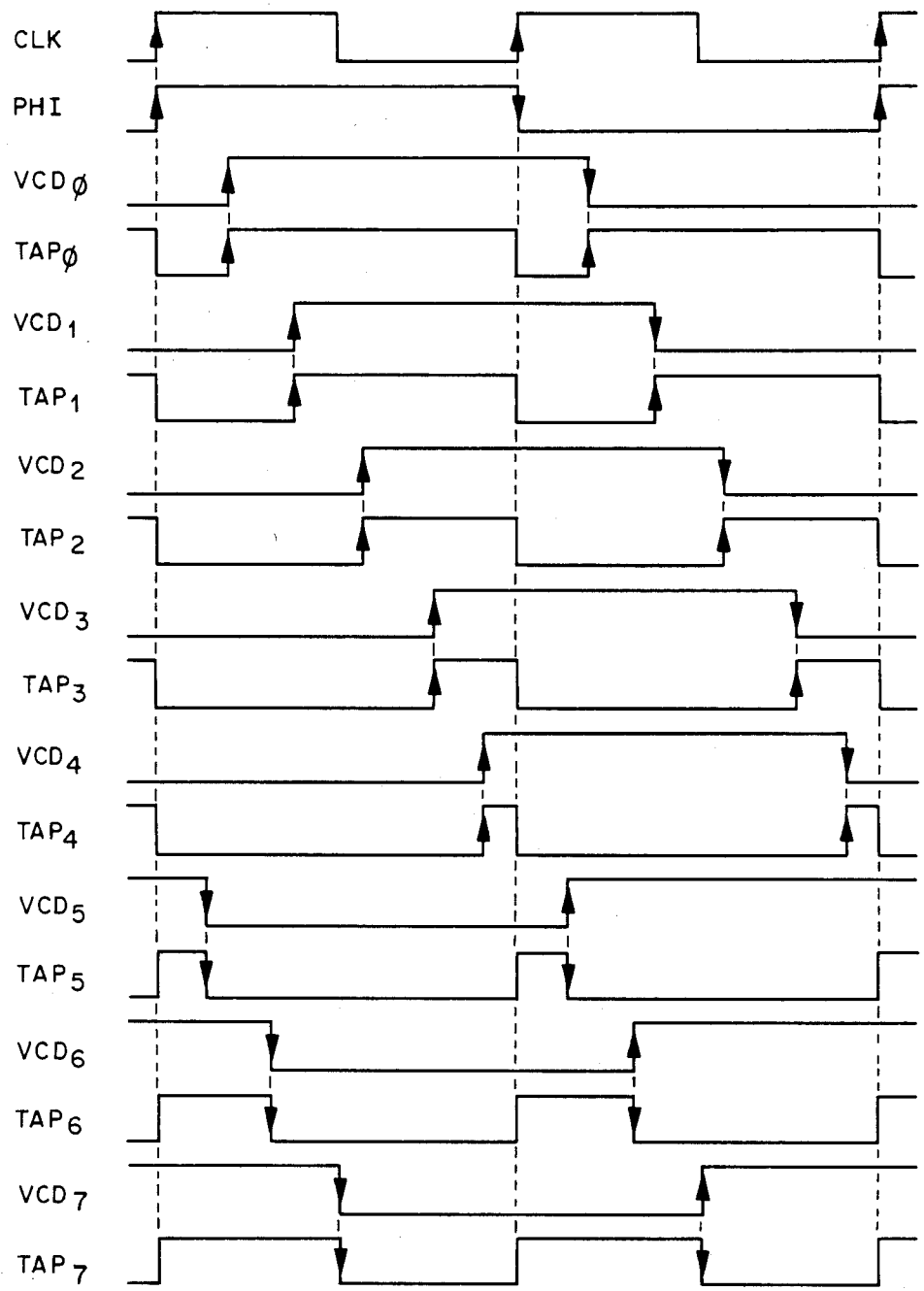
SDL WAVEFORMS FOR TD = 3TP/2

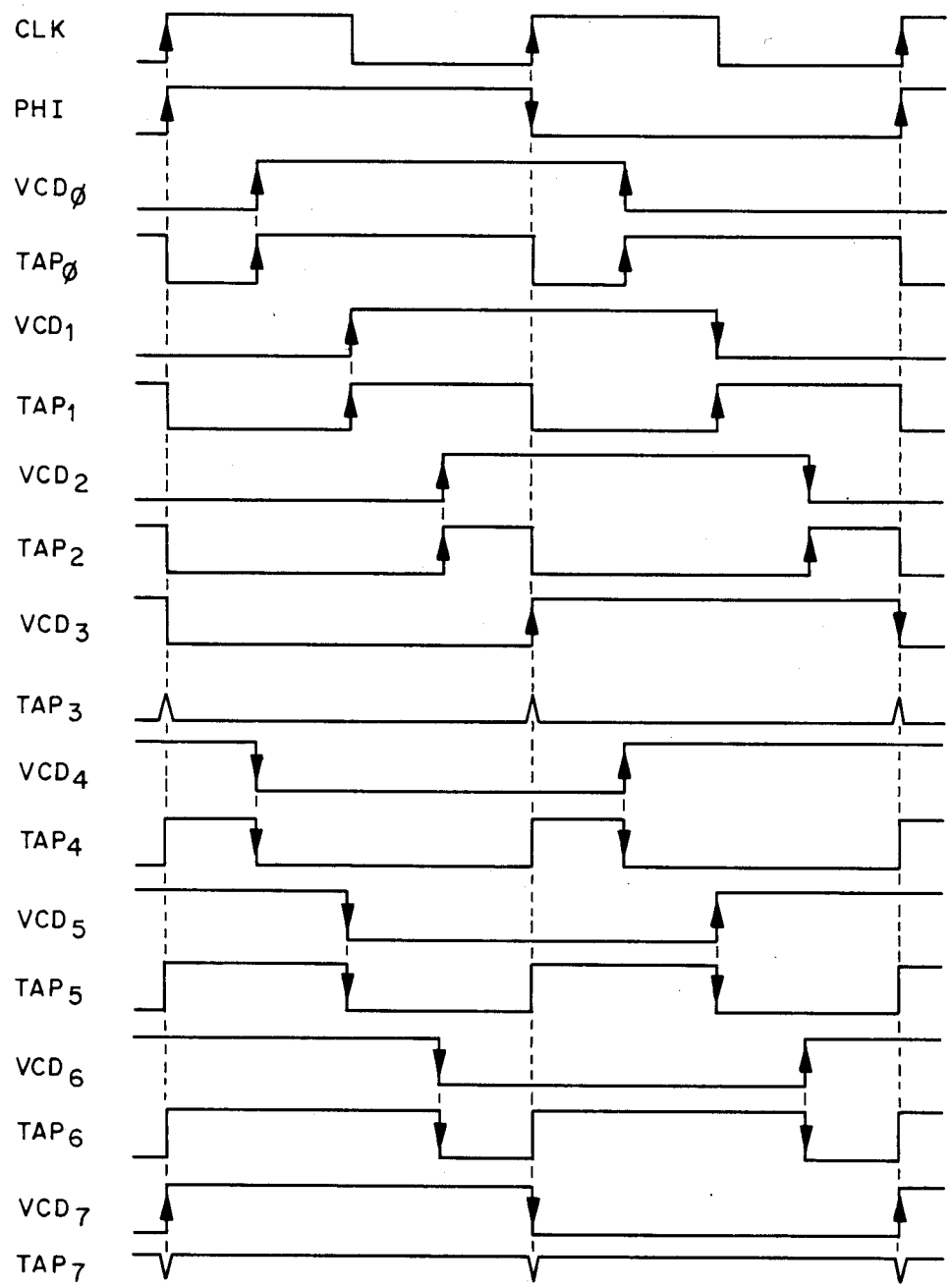
FIG_10
SDL WAVEFORMS FOR TD = 2TP

FIG_11
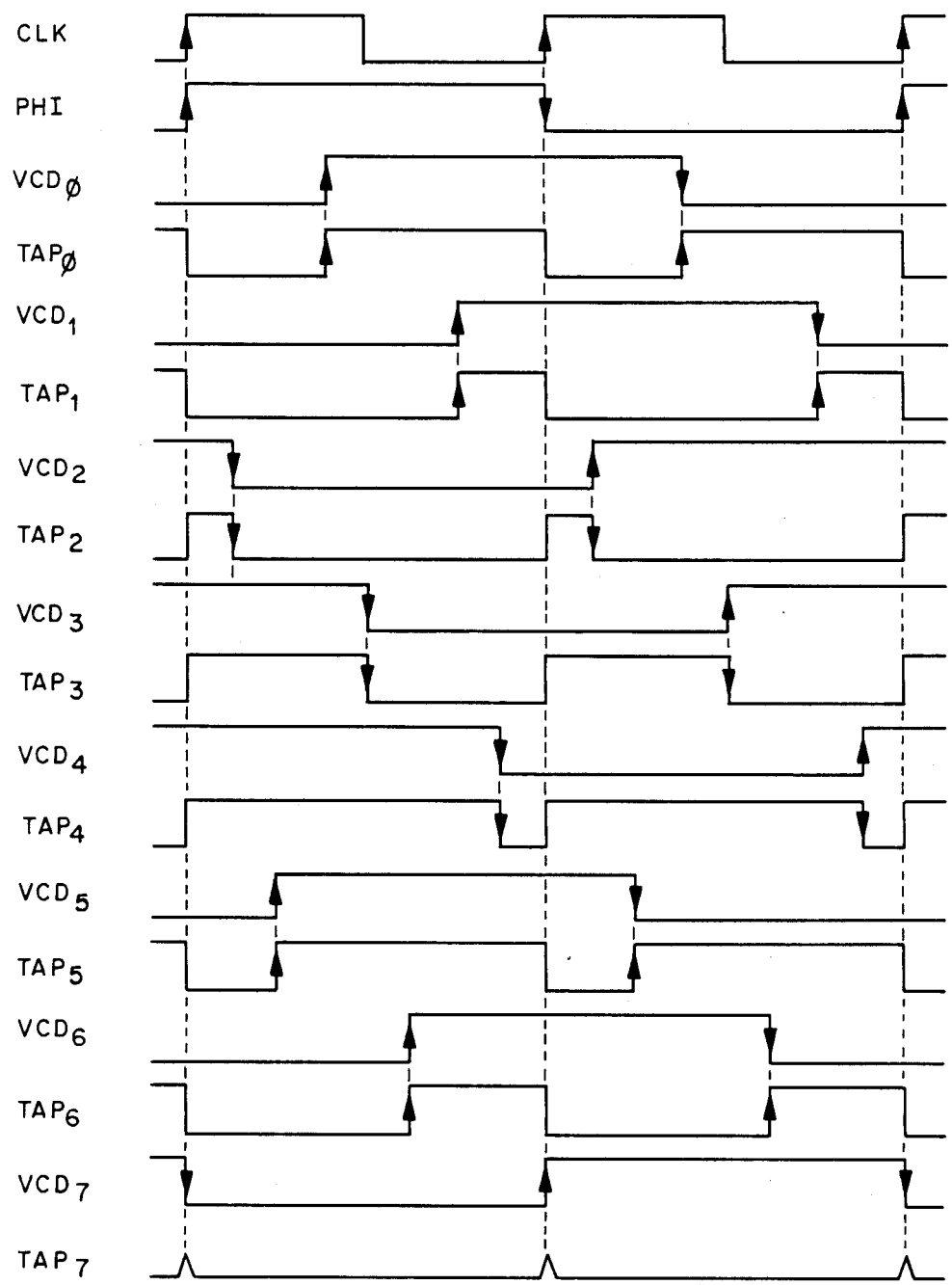
SDL WAVEFORMS FOR TD = 3 TP

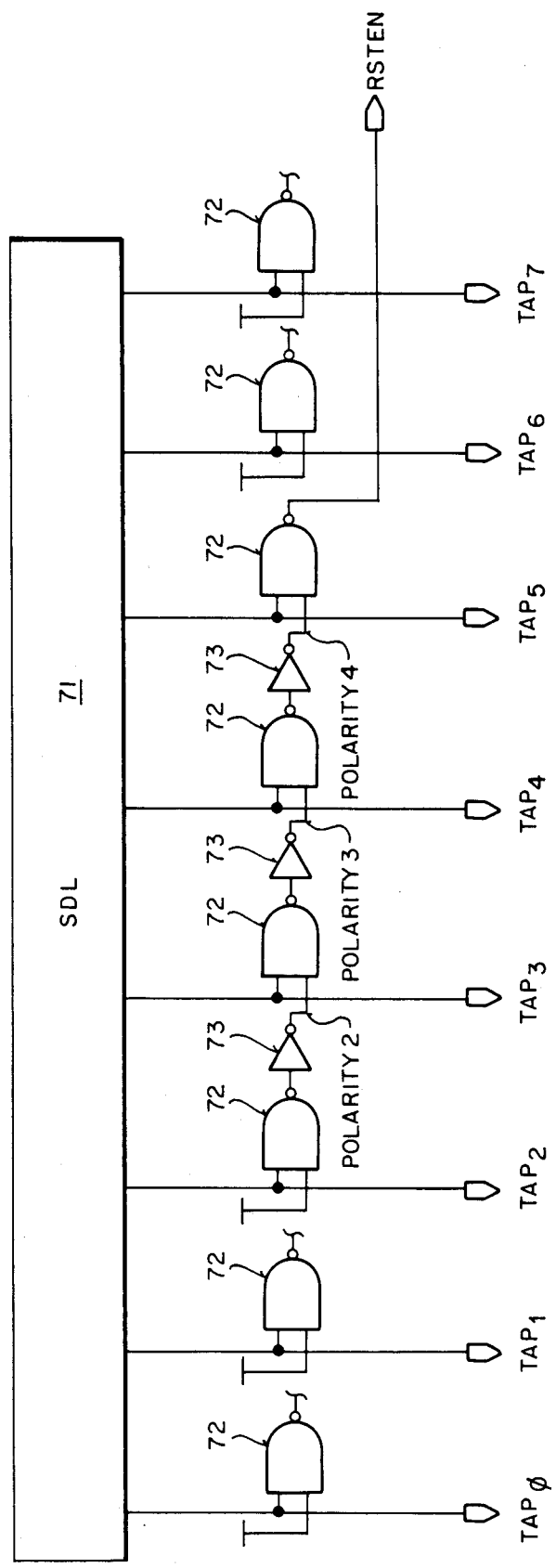
FIG_12

FIG_13
| TAP | TD = TP | | TD = 2TP | | TD = 3TP | |
|---|---|---|---|---|---|---|
| | $t$SUmgn,n | POLARITY | $t$SUmgn,n | POLARITY | $t$SUmgn,n | POLARITY |
| 3 | 0.19 | + | −0.06 | + | −0.31 | + |
| 4 | 0.19 | + | −0.13 | + | −0.44 | + |
| 5 | 0.19 | + | −0.19 | + | 0.44 | − |
| 6 | 0.19 | + | −0.25 | + | 0.31 | − |
| 7 | 0.19 | + | 0.69 | − | 0.19 | − |
| 8 | 0.19 | + | 0.63 | − | 0.06 | − |
| 9 | 0.19 | + | 0.56 | − | −0.06 | − |
| 10 | 0.19 | + | 0.50 | − | 0.81 | + |
| 11 | 0.19 | + | 0.44 | − | 0.69 | + |
| 12 | 0.19 | + | 0.38 | − | 0.56 | + |
FIG_14
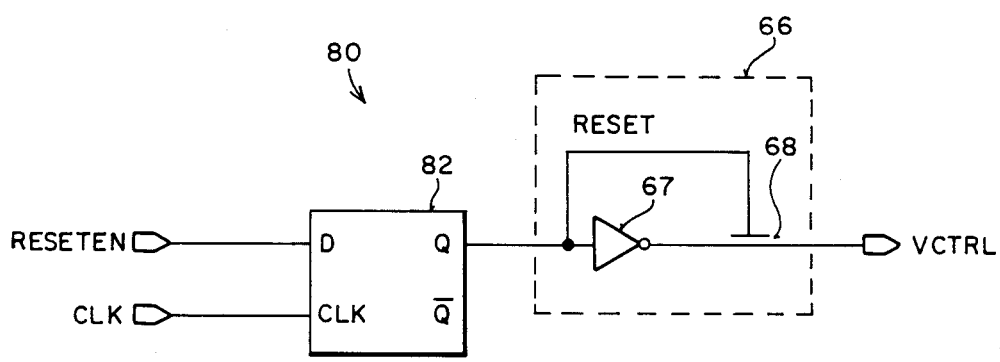

SYNCHRONOUS DELAY LINE WITH AUTOMATIC RESET

BACKGROUND OF THE INVENTION

1. Field of the Invention

The present invention relates to the field of generation of timing pulses having precise delays and more particularly to synchronous delay lines as used in metal-oxide semiconductor (MOS) integrated circuits.

2. Related Application

This application is related to copending application, Ser. No. 07/434408, filed 11/13/89, and entitled "Synchronous Delay Line with Quadrature Clock Phases".

3. Prior Art

In an integrated circuit, having a memory, processor, and/or other circuitry, it is necessary to have clocking or timing signals for various uses, such as latching of address signals, decoding the address signals and etc. One technique of generating "on-chip" timing signals is by the use of a synchronous delay line. Prior art techniques of utilizing a synchronous delay line are described in U.S. Pat. No. 4,496,861 entitled "Integrated Circuit Synchronous Delay Line" and in an article entitled "A Novel Precision MOS Synchronous Delay Line", IEEE Journal of Solid State Circuits, Volume SC-20, pp. 1265-1271, December 1985. The synchronous delay line is used to generate timing pulses designed to have precise delays from the start of a clock period. This particular synchronous delay line receives a clock reference signal and provides a series of taps, wherein each tap provides a timing pulse that has a precise delay from the commencement of a clock cycle which is initiated by the reference clock.

Although the synchronous delay line described in the above-mentioned prior art references provides for on-clip timing signals having very high timing accuracy and which is also insensitive to variations due to processing, supply voltage and temperature, it has a disadvantage in that a reset scheme is needed.

Typically the synchronous delay lines require a reset during power-up, in order to assure that the synchronous delay line enters its fundamental mode of operation. In the prior art synchronous delay lines, such as that described in U.S. Pat. No. 4,496,861, the delay line requires an externally generated reset signal to provide the reset function during power-up. However, integrated circuit devices utilizing external resets typically require a reset pin dedicated to receiving such an external reset signal. Furthermore, since the SDL requires many clocks (typically several hundred clocks) to achieve steady-state operation after reset, the operation of the integrated circuit device utilizing the SDL must be inhibited after reset during the time the SDL is not in the steady-state.

As will be seen, the present invention provides for an internal reset scheme, so that external reset inputs are not required and, therefore a reset pin need not be dedicated for receiving the external reset signal. Likewise, the internal reset scheme allows the SDL to achieve steady-state operation well before system reset is complete, so that the SDL is already in its steady state when reset is complete, and the operation of the integrated circuit device utilizing the SDL need not be inhibited.

SUMMARY OF THE INVENTION

An automatic reset scheme implemented within a circuit for resetting an integrated circuit delay line apparatus is described. The synchronous delay line is composed of a plurality of serially arranged voltage controlled delay stages, wherein each of the delay stages is coupled to receive a control signal which controls the duration of the delays. A reference clocking signal is coupled to the delay stages, wherein the first stage receives the reference signal, and each of the remaining delay stages are coupled to sequentially receive the reference signal but having a predetermined delay. A sample-and-hold circuit coupled to the last delay stage is used to provide an analog control voltage as a feedback to control the delay within each of the delay stages.

In the preferred embodiment, a phase generator is used to generate a complementary pair of phasing signals which is in the phase with the reference clock signal to control the outputs of a pair of cross-coupled NAND gates within each delay stage. In order to provide the automatic resetting scheme, so that an external reset signal is not required, the present invention provides for an automatic reset scheme in which the synchronous delay line is caused to be reset only if it has not stabilized in the fundamental mode of operation.

The reset circuit is coupled to the various tap outputs of a number of delay stages and is used to detect a change in polarity at the output of the various selected taps. In the fundamental mode of operation the outputs all have the same polarity, whereas in one of the subharmonic modes of operation one or more of the delay stages will provide an output having an inverted polarity. If the synchronized delay line powers up to one of the subharmonic modes of operation then the reset circuit causes the sample-and-hold circuit to be reset.

BRIEF DESCRIPTION OF THE DRAWINGS

FIG. 1 is a generalized prior art synchronous delay line block diagram.

FIG. 2 is a block diagram of a synchronous delay line used with the present invention.

FIG. 3 is a circuit schematic diagram of a phase generator of the synchronous delay line of the present invention.

FIG. 4 is a circuit schematic diagram of a voltage controlled delay stage of the delay line of FIG. 2.

FIG. 5 is a circuit schematic diagram of a portion of a sample-and-hold circuit of the delay line of FIG. 2.

FIG. 6 is a waveform diagram showing the phasing waveforms used in the sample-and-hold circuit of FIG. 5.

FIG. 7 is a delay line waveform diagram for TD=TP/2.

FIG. 8 is a delay line waveform diagram for TD=TP.

FIG. 9 is a delay line waveform diagram for TD=3TP/2.

FIG. 10 is a delay line waveform diagram for TD=2TP.

FIG. 11 is a delay line waveform diagram for TD=3TP.

FIG. 12 is a block diagram showing a polarity checking circuit of the preferred embodiment.

FIG. 13 is a table showing a setup-time margin for various values of TD.

FIG. 14 is a circuit schematic diagram of a reset control circuit of the preferred embodiment.

DETAILED DESCRIPTION OF THE PRESENT INVENTION

A precision synchronous delay line which uses an automatic reset scheme is described. In the following description numerous specific details are set forth, such as specific circuits, in order to provide a thorough understanding of the present invention. It will be obvious, however, to one skilled in the art that the present invention may be practiced without these specific details. In other instances, well known circuits are not described in detail in order not to unnecessarily obscure the present invention.

Referring to FIG. 1, a generalized prior art synchronous delay line (SDL) 10 is shown. SDL 10 is comprised of a divide-by-two circuit 11, a plurality of series-coupled voltage-controlled delay (VCD) stages 12 and a sample-and-hold circuit 13. In the example of FIG. 1, circuit 10 is comprised of eight VCD stages 12, wherein each of the VCD stages 12 provides an output which corresponds to the various tap outputs of the SDL 10. It is to be noted that the number of taps available from SDL 10 is a function of the number of VCD stages 12 with such number of stages being a design choice.

A reference clock signal CLK is divided to provide a phasing clock signal PHI as an input to the first VCD stage 12. Each VCD stage then provides the delay which is coupled to the next VCD stage. Each VCD stage 12 output is exclusively ORed (XORed) with PHI through XOR gate 14. The output of the XOR gates provide the various $TAP_n$ outputs. The very last TAP output is provided to the sample-and-hold circuit 13 for generation of the delay control voltage VCTRL. An externally-provided reset signal is input to the sample-and-hold circuit 13 for the purpose of forcing the SDL to enter its fundamental mode of operation.

Referring to FIG. 2, a synchronous delay line (SDL) 10a used with the present invention is shown. SDL 10a is similar to the prior art SDL 10 of FIG. 1, except that phase generator 11a is used to provide two clocking phases $PHI_1$ and $PHI_2$ and separate delayed clock phases $PA_n$ and $PB_n$. Eight VCD stages 12a are shown, but the actual number is a design choice. VCD stages 12a are implemented to operated with the new clock phasing signals.

The phase generator 11a receives as its input a reference clock signal CLK and divides the frequency of the clock signal CLK by 2 to generate two 50% duty cycle complementary clock phases $PHI_1$ and $PHI_2$. $PHI_1$ and $PHI_2$ are used to control the outputs of the individual VCD stages 12a. The clocking signal CLK is also coupled as an input to the sample-and-hold circuit 13a.

Two additional complementary clock phases $PA_0$ and $PB_0$ are provided as outputs from phase generator 11a. Signals $PA_0$ and $PB_0$ are also derived from the reference clock signal CLK and have a 50% duty cycle and are complementary to each other. $PA_0$ and $PB_0$ serve as the trigger inputs to the first VCD stage 12a. Although clock phases $PHI_1$ and $PHI_2$ can be used to serve as the trigger inputs to the first VCD stage 12a, separate phase signals $PA_0$ and $PB_0$ are utilized since $PHI_1$ and $PHI_2$ are typically slowed by the heavy capacitive loads that they typically must drive.

The various delays of SDL 10a are provided by each of the VCD stages 12a. Although a variety of circuits can be implemented for each of the stages 12a, one example is described in the aforementioned U.S. Pat. No. 4,496,861. Delay of the timing pulse output from each stage 12a, TAPn, is determined by using the following equation:

$$tDEL_n = (n+1)TP/N + t_{ERR} \qquad \text{(Equation 1)},$$

wherein $tDEL_n$ is the delay of the timing pulse output by a given n stage; N is the total number of stages; TP is the period of the clock signal CLK; and $t_{ERR}$ is a small timing error. The tap outputs from each of the VCD stages 12a are provided by exclusively ORing (XORing) the $PA_n$ and $PB_n$ outputs from each VCD stage with the pair of complementary clock phases $PHI_1$ and $PHI_2$. These clock phases are triggered by the reference clock CLK to switch at the start of a new clock cycle when $PHI_1$ and $PHI_2$ are coupled to each of the VCD stages 12a.

When $PHI_1$ and $PHI_2$ switch, all of the SDL 10a taps go inactive. Subsequently, each tap becomes active after a precise delay time determined by Equation 1. The $PA_n$ and $PB_n$ outputs from each stage 12a are coupled as the clocking inputs to its subsequent VCD stage 12a. The outputs of the final VCD stage 12a are coupled as inputs to the sample-and-hold circuit 13a, as are the clocking signals CLK and $PHI_1$.

The delay of each VCD stage 12a is controlled by an analog control voltage VCTRL, which is generated as an output from the sample-and-hold circuit 13a and coupled back to each VCD stage 12a. If VCTRL is high, the delay of the stages 12a is long, while if VCTRL is low, the delay is short. Because SDL 10a is comprised of N identical delay stages, each stage provides a delay equal to 1/N of the overall delay.

The sample-and-hold circuit 13a samples the value of the output voltage of the last VCD stage 12a at the instant that the clock phases $PHI_1$ and $PHI_2$ transition. The delay control voltage VCTRL is provided as a feedback voltage to each of the stages 12a for the purpose of providing the delay control. If the overall delay through SDL 10a is shorter than the clock period (referred to as TP), a high voltage is sampled at the last VCD stage 12a, and, as a consequence, VCTRL increases in its voltage value. Alternatively, if the overall delay through the VCD stages 12a are longer than the clock period TP, a low voltage is sampled at the last VCD stage 12a, and, as a consequence, VCTRL decreases in value. When VCTRL decreases in value, the overall delay of the SDL decreases also. A pair of sampling capacitors are typically used to retain the sampled voltage.

Further, as shown in FIG. 2, a reset signal is coupled as an input to the sample-and-hold circuit 13a for resetting the SDL 10a. The operation and implementation of SDL 10a is based on the aforementioned U.S. Pat. No. 4,496,861, which is hereby incorporated by reference.

Although various circuit implementations are available for the phase generator 11a, VCD stage 12a and sample-and-hold circuit 13a of FIG. 2, preferred circuit implementations for these circuits are shown in FIGS. 3, 4 and 5 using complementary metal-oxide-semiconductor (CMOS) technology.

A reset input to sample-and-hold circuit 13a is used to reset SDL 10a, and such resetting is needed before proper SDL operation is guaranteed. Such resetting of the SDL 10a is necessary so that SDL 10a enters its fundamental mode of operation. Typically an external reset signal is provided, which requires the presence of a dedicated reset pin on the device. An externally-provided reset also necessitates waiting a period of time, typically hundreds of clocks in length, during which the SDL stabilizes in its fundamental mode of operation. During this stabilization period, the operation of the integrated circuit in which the SDL is used must be inhibited.

Referring to FIG. 3, the phase generator 11a receives a reference clock signal CLK as its input and divides the frequency of the CLK signal by two to generate two 50% duty cycle complementary clock phases $PHI_1$ and $PHI_2$. The CLK signal is coupled to the clock input of a D-type flip-flop 32 in which $PHI_1$ is obtained from the output Q while $PHI_2$ is obtained from the output Q/ (/ is hereinafter used to indicate a complementary condition). Both $PHI_1$ and $PHI_2$ are each coupled through a dual inverter buffer stage 34. The CLK signal is also coupled to the clock input of a D-type flip-flop 33. Two additional complementary clock phases $PA_0$ and $PB_0$ are obtained from Q and Q/ outputs, respectively, of flip-flop 33. Clock phases $PA_0$ and $PB_0$, which are logically identical to $PHI_1$ and $PHI_2$, serve as the trigger inputs to the first VCD stage 12a. Separate clock phases $PA_0$ and $PB_0$ are provided since PHI1 and PHI2 clock phases are typically slowed down by the heavy capacitive loading which they must drive. $PA_0$ and $PB_0$ are used since the overall precision of the SDL 10a is improved by decreasing the delay time of the trigger inputs with respect to the clock signal CLK. The D input to both flip-flops 32 and 33 are derived from the $PHI_2$ output.

Referring to FIG. 4, a diagram for one stage of the VCD stage 12a is shown in schematic form. However, it is to be appreciated that a variety of circuits can be implemented for the VCD stage 12a in the practice of the present invention without departing from the spirit and scope of the present invention. In each stage 12a, PA and PB inputs are coupled in as input A and input B, respectively, to a cross-coupled NAND gate pair, wherein the output of NAND gate A provides output A, and the output of NAND gate B provides output B. The output of NAND gate A, referenced as node 38, is coupled to a pair of CMOS capacitors 39, while the output of NAND B, referenced as node 40, is coupled to a pair of CMOS capacitors 41.

The delay of each VCD stage 12a is controlled by an analog control voltage VCTRL, which is generated by the sample-and-hold circuit 13a and which is coupled to control the coupling of node 38 to capacitors 39 and also node 40 to capacitors 41. The control voltage VCTRL controls the SDL 10a delay by causing the transition times of the cross-coupled NAND gates A and B to be long for NAND gate output voltages that are less than or equal to VCTRL minus VT, and to be short for output voltages that are greater than VCTRL minus VT. Voltage VT is the threshold voltage of each of the N-type pass devices 42 and 43 which couples the appropriate NAND gate output to its load capacitors 39 or 41, respectively. For NAND gate output voltages that are less than VCTRL minus VT, the NAND gate outputs are fully loaded down by the capacitors. Alternatively, for NAND gate output voltages that are greater than VCTRL minus VT, the capacitors are effectively disconnected from the NAND gate output nodes. By varying VCTRL, the fraction of a NAND gate output transition during which the output is fully loaded down by the load capacitors is varied. The greater the fraction of a transition during which the output is fully loaded down, the longer the overall transition time. Either the output node 38 or 40 is coupled as the tap output, wherein the state of the clock signals coupled to SA and SB inputs determine which node is coupled as the tap output. The complementary clock phasing signals $PHI_1/PHI_2$ are provided as inputs SA and SB as shown in FIG. 2. Each controls a pair of CMOS pass devices 46 and 47, such that when the input to SA is high and the input to SB is low, the output of NAND A is coupled as the tap output through inverter buffer 48. Alternatively, when the input to SA is low and the input to SB is high the output of NAND gate B is coupled as the tap output. The outputs A and B are coupled as PA and PB signals to the next stage.

Referring to FIG. 5, a sample-and-hold circuit 13a of the preferred embodiment is shown. Also coupled to the sample-and-hold circuit 13a are the clock phases $PHI_1$ and $PHI_2$, wherein clock phases $SPHI_1$ and $SPHI_2$ are generated. It is to be noted that $SPHI_1$ and $SPHI_2$, as well as their complementary outputs $SPHI_1/SPHI_2/$, are non-overlapping clock phases. Circuit 45 samples the value of the output voltage $PA_n$ and $PB_n$ of the last VCD stage 12a at the instant that the clock phases, $SPHI_1$ and $SPHI_2$ and their complements make a transition. The sample-and-hold clock phasing signals $SPHI_1$ and $SPHI_2$ and their complements $SPHI_1/$ and $SPHI_2/$, are generated within the sample-and-hold circuit 13a. $SPHI_1$ is basically a replication of the clock phase signals $PHI_1$ and $SPHI_2$ which is a replication of the clock phase signal $PHI_2$. As shown in FIG. 5, these sample-and-hold clock phase signals are used to pass each of the input signals PA and PB of the last stage 12a of SDL 10a to provide the VCTRL signal at the output of circuit 45. Input $PA_n$ is passed through an inverter buffer 50 which output is then coupled to a pair of CMOS capacitors 51 through CMOS pass devices 52 controlled by $SPHI_2$ and $SPHI_2/$. The pair of capacitors 51 are coupled to a pair of CMOS output capacitors 55 through CMOS pass devices 53 which are controlled by $SPHI_1$ and $SPHI_1/$.

Equivalently, $PB_n$ is coupled through an inverter buffer 60 which output is then coupled to a pair of CMOS capacitors 61 through CMOS pass devices 62 which are controlled by $SPHI_1$ and $SPHI_2/$. Capacitors 61 are coupled through CMOS pass devices 63 to the CMOS capacitors 55. Pass devices 63 are connected by $SPHI_2$ and $SHPI_2/$. The output capacitors 55 are also a CMOS pair and the values of the capacitors 55 are much larger in size as compared to capacitors 51 and 61. Capacitors 51 have values identical to those of capacitors 61. The sample-and-hold clock phasing signals $SPHI_1$, $SPHI_1/$, $SPHI_2$ and $SPHI_2/$ are non-overlapping signals which are used to open and close the pass devices 52, 53, 62 and 63 so that proper liming is provided for transferring the input signals to the output without any overlap from occurring. That is, when devices 52 are open for passing the PA signal to capacitors 51 for the purpose of charging up capacitors 51, the clock phases prevent the passage of this voltage to the output capacitors 55 due to the fact that devices 53 are closed. During this time period when devices 52 allow the passage of signal PA to charge capacitors 51, devices 63 are open permitting capacitors 61 to be coupled to the output capacitors 55. Alternatively, when devices 62 are open allowing the signal PB to charge capacitors 61, devices 63 ensure that capacitors 61 are isolated from the output capacitors 55. However, during this period, devices 53 are open allowing capacitors 51 to discharge and charge capacitors 55. Therefore, the sampled voltage is held on the smaller sampling capacitors 51 and 61 at corresponding times, and on the following clock phase the corresponding sampling capacitors are coupled to the output capacitors 55. Capacitors 55 operate as a second sampling capacitor, but having a much larger size than the first set of capacitors 51 or 61. On account of the large ratio in size of the output capacitors 55 to either of the first pair of capacitors 51 or 61, the voltage of the second capacitor charges only slightly, even for a large sampled voltage on the first set of capacitors. Thus, the sampled voltage is effectively attenuated as a result of the large size ratio of the capacitors. This attenuation is used in order to guarantee stable SDL operation. Without the attenuation, the SDL feedback could become positive under certain conditions and cause unstable operation, such as oscillation.

The attenuated voltage is then fed back to each of the VCD stages 12a as the delay control voltage VCTRL. If the overall delay through the VCD stages is shorter than the clock period TP, a high voltage is sampled from the last VCD stage 12a. As a consequence, VCTRL increases, causing the overall delay of the VCD stages to increase also. Over several clock periods, the overall delay through the VCD stages gradually increases until the delay just equals the clock period TP. Alternatively, if the overall delay through the VCD stages 12a is longer than the clock period TP, a low voltage is sampled from the last VCD stage 12a of SDL 10a. As a consequence, VCTRL decreases, causing the overall delay of the VCD stages to decrease also. Again, over several clock periods, the overall delay through the VCD stages 12a will gradually decrease until the delay just equals the period TP. Thus, whether the overall delay through the VCD stages is greater than or less than the clock period TP, the VCD delay corrects itself through the negative feedback provided by VCTRL, until the overall delay just equals TP. In the preferred embodiment, $SPHI_1$ and $SPHI_2$ and their complements are obtained from the signals $PHI_1$ coupled from the phase generator. Because $PHI_2$ is a complement of $PHI_1$, it need not be provided by phase generator 11 to sample-and-hold circuit 13, however it could readily be so provided. It is to be appreciated that other techniques can be readily implemented to generate these sample-and-hold clock phasing signals.

Referring to FIG. 6, sample-and-hold waveforms $SPHI_1$, $SPHI_1/$, $SPHI_2$ and $SPHI_2/$ are shown in respect to the clock signal CLK and the phasing signals $PHI_1$ and $PHI_2$. It is to be noted that in order to prevent the overlapping from occurring in passing the signal through the various pass devices, 52, 53, 62 and 63, a slighty non-uniform (not 50%) duty cycle is used for the sample-and-hold phasing signals. The duty cycles of the portion of the waveforms which activate these various devices 52, 53, 62 and 63 are less than 50%, such that the positive portion 20 of the $SPHI_1$ waveforms and the negative going portion 21 of the $SPHI_1/$ waveform activates pass devices 62 and 53 for less than 50% of the cycle. That is, the pulse width is less than the duration TP. Likewise, the positive going portion 22 of $SPHI_2$ and the negative going portion 23 of $SPHI_2/$, which are used to activate devices 52 and 63 are also of a duration less than the period TP.

Referring again to FIG. 5, a reset circuit 66 is shown comprised of an inverter 67 and a pass device 68. In order to guarantee SDL operation in the fundamental mode, the sample-and-hold capacitors 55 are initially discharged to zero volts. When a reset signal RST goes to a high state, the source of the pass gate 68 goes low while the gate of the pass device 68 goes high. Thus when RST is high, the pass device conducts and discharges the output capacitors 55 discharging it to zero volts. If RST is low, the gate of the pass device 68 is low while the source of the pass device 68 is high causing the pass device 68 to be cut-off. This cut-off condition of pass device 68 constitutes an effectively infinite resistance in parallel with the output capacitors 55. It is to be appreciated that other reset circuitry 66 can be readily implemented to provide an equivalent function. The configuration of circuit 66 has the advantage of being highly noise insensitive, since the pass device 68 turns on only for noise spikes which are greater than VCTRL+VT, VT being the threshold voltage of the pass device 68.

After RST is deasserted, the control voltage VCTRL begins rising as a result of the operation of the SDL. When the value of VCTRL which corresponds to the fundamental mode of operation is reached, VCTRL levels off to its steady state value.

When an external reset (external to the chip) is used to reset the circuit of FIG. 5, a substantial amount of "dead" time is required after RST is deasserted so that the SDL can attain its steady-state operation. The time required for VCTRL to attain its steady-state value can be quite substantial. During this dead time, the SDL does not provide timing pulses with delay times that obey equation 1. Rather, the delay times are typically less than those determined by equation 1. Therefore, the integrated circuit in which the SDL resides cannot be guaranteed to operate according to requisite specifications during which the SDL is in the process of attaining its steady-state operating state. While this dead time only occurs once, after reset, it must be taken into account nevertheless in a system the integrated circuit is intended for.

An analysis of the rise of VCTRL after reset shows that VCTRL (n), the value of VCTRL after n clock periods have elapsed since reset was deasserted, is given by:

$$VCTRL(n) = VCC[1 - exp(-n/r)] \quad \text{(Equation 2)},$$

where r is the capacitor ratio CCTRL/CR (capacitance of devices 55 divided by capacitance of devices 51 or 61) in the sample-and-hold circuit 45 of FIG. 5. Rearranging equation 2 provides:

$$n = -r*ln[1 - VCTRL(n)/VCC] \quad \text{(Equation 3)}$$

Equation 3 may be used to estimate the time required by the SDL to attain steady state operation after reset is deasserted. For example, taking a hypothetical value where r=50 and where the steady-state value of VCTRL is 0.9 VCC, then from Equation 3, n=115. In this particular example, for the first 115 clock periods after the deassertion of reset RST, the SDL is in the process of attaining its steady-state condition, and the SDL timing pulses are not dependable for circuit use.

Therefore, one disadvantage of utilizing an externally (external to the SDL) generated reset signal is that substantial dead time is encountered after reset is deasserted. Further, in some instances where integrated circuits do not have a reset pin available or where an external reset pin is not desirable, other means of reset must be provided to assure operation of the SDL at its fundamental mode.

RESET SCHEME OF THE PREFERRED EMBODIMENT

In order to understand the operation of the reset mechanism of the preferred embodiment, it is necessary to examine the various modes of operation of the SDL in some detail. The generalized block diagram of an eight-tap SDL of FIG. 1 is used to provide a foundation for the reset scheme of the present invention. The use of two phases are required in order to obtain symmetrical operation of the SDL $10a$ on opposite clock phases. However, it is to be appreciated that the reset scheme of the present invention is actually adapted for use with SDL $10a$ of FIG. 2, in which case $PHI_1$ and $PHI_2$ would govern the clocking of SDL $10a$ and $PA_n$ and $PB_n$ governs the $VCD_n$ inputs to the next stage.

Also referring to FIG. 7, 8, 9, 10 and 11, waveform comparisons for total VCD delay TD is shown for TD equal to TP/2, TP, 3TP/2, 2TP and 3TP, where TP is the period of the reference clock CLK. TD is a direct function of VCTRL, which can have any one of several values during power up conditions. In FIG. 7, a condition for TD equal to TP/2 is shown. The output of each VCD stage 12 appears as a delayed replica of PHI. The delay of the output of each VCD stage 12 is given by the equation:

$$(n+1)TD/N = (n+1)TP/2N = (n+1)TP/16 \quad \text{(Equation 4)},$$

where n is the particular numbered tap in the present example. The output of the last tap is also sampled on each transition of PHI into the sample-and-hold circuit 13. Because TD is much less than TP, a high voltage is sampled into the sample-and-hold circuit of circuit 13 on each transition of PHI. This large sample voltage causes the VCTRL to increase gradually until TD equals TP.

Delay waveforms for TD equal to TP are illustrated in FIG. 8. The delay of each tap is given in this instance by:

$$(n+1)TP/8 \quad \text{(Equation 5)},$$

which is the delay specified by equation 1. Therefore, when TD is equal to TP, the SDL operates in its fundamental mode. It is to be noted that the output of the last tap, $TAP_7$, is typically a glitch, a condition which is described in the aforementioned copending application.

The waveforms for TD equal to 3TP/2 is illustrated in FIG. 9. Here the delay of the clock phase appearing at each VCD output is given by:

$$3(n+1)TP/16 \quad \text{(Equation 6)}.$$

As a result of the large delay, more than one PH "wave" are present simultaneously inside of the delay line, because the interval between each transition of PHI is shorter than TD. Three phenomena caused by this condition are noted. Firstly, tap transitions are not always sequentially in order of tap numbers; the tap outputs near the end of the delay line are inverted; and as a result of this invention the voltage sampled into the sample-and-hold circuit 13 is zero.

The second effect, in which several of the tap outputs are inverted, happens only for TD greater than TP. Therefore, tap inversion is a reliable indication of the condition in which TD is greater than TP. The third effect results in the SDL lowering VCTRL gradually until TD returns to the value of TP, a condition which constitutes SDL fundamental mode operation.

Further examination shows that for TD less than 2TP, the SDL always corrects VCTRL in a direction that returns TD to the value of TP, while for TD greater than 2TP, the SDL always corrects VCTRL in a direction that drives TD to 3TP. For TD exactly equal to 2TP, the SDL is an metastable state from which it corrects VCTRL to either TP or 3TP at the slightest disturbance, such as one caused by noise. In this metastable state, the SDL feedback is positive, instead of negative, meaning that any disturbance to the SDL destabilizes the SDL. The SDL waveforms for a TD of exactly 2TP appears in FIG. 10. It is noted that $TAP_7$ also has a glitch. The fact that the glitch is negative, instead of positive as in the fundamental mode of operation, causes the SDL to stabilize at a TD of either TP or 3TP at the slightest disturbance.

The SDL waveform for a TD equal to 3TP is illustrated in FIG. 11. The outputs of the first and last third of the taps are not inverted, while the outputs of the middle third are inverted. Furthermore, the output of the last tap is sampled again as a short glitch, just as for the condition of TD equal to TP, so that the SDL maintains VCTRL at the value required to maintain TD at the value of 3TP. Small disturbances to TD result in changes to VCTRL that return TD to a value of 3TP. Thus, the condition where TD equals 3TP is a stable operating point and constitutes the first subharmonic mode of operation.

In the instance when TD has a value between 2TP and 4TP, the SDL causes VCTRL to change in such a fashion that TD stabilizes at the value of 3TP. Similarly, for TD between 4TP and 6TP the SDL causes VCTRL to change in such a fashion that TD stabilizes at the value of 5TP. In general the modes of SDL operation can be summarized as follows:

Fundamental mode
  $0 < TD < 2TP$, where the stable operating point is at $TD = TP$;
First subharmonic mode
  $2TP < TD < 4TP$, where the stable operating point is at $TD = 3TP$;
Second subharmonic mode
  $4TP < TD < 6TP$, where the stable operating point is at $TD = 3TP$; and
The Nth subharmonic mode
  $2N^*TP < TD < 2(N1)TP$; where the stable operating point is at $TD = (2N+1)TP$.

In analyzing the operation of the SDL in the subharmonic modes of operation as illustrated in FIGS. 7-11, it can be determined that the delay of each tap is given by:

$$tDEL_n = \{[(n+1)/N]^*TD\}MOD(TP) \quad \text{(Equation 7)}$$

where MOD is defined as the modulo function. The modulo function accounts for the rap-around phenomenon in which taps may output transitions prior to outputs from the taps that proceed them.

The reset scheme of the present invention is an automatic reset scheme which relies on the fact that the SDL requires a reset only if its has stabilized in one of the subharmonic modes of operation. If the SDL has stabilized in the fundamental mode of operation, no reset is necessary. Thus, the SDL resets only if a subharmonic mode of operation is encountered. This reset scheme of the present invention requires no external intervention such as an external reset signal.

The reset scheme of the preferred embodiment checks the SDL mode of operation once every clock period. If the SDL is found to be in the fundamental mode of operation no action is taken. However, if the SDL is found to be in one of the subharmonic modes of operation, the reset mechanism is activated. After reset is achieved, the reset mechanism is deactivated and the SDL is allowed to stabilize again. Since the first stable operating point reached by the SDL in this fashion is the fundamental mode of operation, that is the mode the SDL will stabilize in after reset.

In order to detect the mode of operation of the SDL in the preferred embodiment, the present invention checks the polarity of the SDL taps at the end of each SDL cycle. In the fundamental mode, all of the taps have the same polarity at the end of each SDL cycle. However, in any of the subharmonic modes, one or more taps will have an inverted polarity at the end of an SDL cycle. Thus, if at the end of any SDL cycle any tap output is found to be inverted in polarity, operation in one of the subharmonic modes is assumed and reset is asserted.

In the actual practice of the present invention, the preferred embodiment checks only the taps in the middle portion of the SDL. The taps at the beginning and at the end of the SDL chain are not checked. The taps at the end of the SDL are not checked, because in the fundamental mode of operation these taps attain correct polarity only at the end of the SDL cycle. Thus, the setup-time from these taps to the edge of the clock signal is small and may be difficult to achieve. On the other hand, the taps at the beginning of the SDL are almost always of non-inverted polarity, thus including them in the polarity check is not necessary. However, it is to be noted that all of the taps can be readily checked for polarity.

Referring to FIG. 12, a polarity checking circuit 70 of the preferred embodiment is shown. An SDL 71 comprised of an arbitrary number of VCD stages can be used. In this particular example eight taps are used. A prior art SDL, such as SDL 10 of FIG. 1 can be used. The reset scheme of the present invention as actually implemented is used with the SDL 10a of FIG. 2. In this example, only the polarities of $TAP_2$, $TAP_3$, $TAP_4$ and $TAP_5$ are checked. Nonetheless, in order to match the capacitive loads of all of the taps, so that delay skews between the taps are not unnecessarily created, $TAP_0$, $TAP_1$, $TAP_6$ and $TAP_7$ are coupled to dummy circuits which load these taps exactly as TAPs 2-5 are loaded. As shown in the example SDL 71, $TAP_0$-$TAP_7$ corresponding to the $TAP_n$ outputs of the earlier described SDL. Each TAP output is coupled as an input to a NAND gate 72. For the dummy circuitry, the corresponding NAND gates 72 have the second input of the NAND gate 72 coupled to a high voltage source and the output terminated. For those tap stages having its polarity detected, $TAP_2$-$TAP_5$, each tap stage NAND gate 72 output is coupled through an inverter to the second NAND gate 72 input of the subsequent stage. The second input to the NAND gate 72 of the first stage being detected is coupled to high, while the output of the last NAND gate of the stage being detected is coupled out to provide a reset enable signal RSTEN.

In the fundamental mode of operation, the taps of the circuit of FIG. 12 goes high successively from $TAP_0$ to $TAP_7$. For example, when $TAP_2$ goes high, signal POLARITY2 also goes high after two gate delays. Next, when $TAP_3$ goes high, POLARITY3, which is formed from the logical AND of POLARITY2 and $TAP_3$ also goes high, similarly at after two gate delays from $TAP_3$. This process is repeated sequentially down the polarity-checking circuit. At the last stage of the detecting circuit, $TAP_5$ in the example of FIG. 12, the TAP signal causes the output of the circuit RSTEN to go low. RSTEN is then sampled by the clocking signal in the sample-and-hold circuit 13 or 13a. Because in the fundamental mode RSTEN is sampled low by the clock signal, reset is never asserted in the fundamental mode.

However, in any subharmonic mode of operation, if even a single tap has inverted polarity, RSTEN goes high. When RSTEN is then sampled active by the clock signal, reset is enabled and VCTRL is forced to zero volts. The example configuration of the polarity checking circuit 70 implements the logic equation:

$$RSTEN = [TAP2/] + [TAP3/] + [TAP4/] + [TAP5/] \text{ (Equation 8)}.$$

Therefore, circuit 70 implements the active-low OR function which is also an active-high NAND function.

For the general case of an SDL with n taps, in which the first and last M taps are not checked for polarity, the logic equation of RSTEN is given by:

$$RESTEN = [TAP(M)/] + [TAP(M+1)/] + \ldots + [TAP(N-M-1)/]. \quad \text{(Equation 9)}$$

It is to be appreciated that other circuit configurations can be readily implemented to provide the equivalent logic as described in equations 8 and 9 for use in the present invention. Further, the actual number of taps which are actually detected can also be varied without departing of this spirit and scope of the present invention.

For correct operation of the polarity-checking circuit, the propagation delay through the polarity-checking circuit must be such that in the SDL fundamental mode of operation RSTEN goes low with sufficient setup-time to the clocking signal, while in the subharmonic mode of operation, RSTEN goes high with sufficient set-up to the clocking signal.

As shown in circuit 7, the two gates 72 and 73 in each stage of the polarity-checking circuit 70 should not have more delay than the two NAND gates in the corresponding VCD stage in the SDL, since the two NAND gates A and B (of FIG. 4) are more heavily loaded than the two gates 72 and 73 of the polarity checking circuit 70. Therefore, placing a worst case upper bound on the delay of a single stage of the polarity checking circuit 70 would be a value of TP/N, the delay of a single VCD stage 12a. In actual practice the delay of a single stage of the polarity checking circuit 70 is significantly less than TP/N.

In the fundamental mode of operation, for an SDL with N stages, and in which the first and last M taps are not checked for polarity, the taps which are checked for polarity must become valid with a setup-time given by:

$$tSU_n = (N - M - n - 1)*TP/N, \ M < n < N - M - 1 \quad \text{(Equation 10)}$$

where $tSU_n$ is the required setup-time of $TAP_n$. It is to be noted that the last M stages of the SDL are not checked for polarity, thereby reducing the setup-time requirement for every tap by $M*TP/N$.

In any subharmonic mode of operation, it is required that only one of the inverted taps become inverted with a setup-time equal to or greater than that given by equation 10, since one tap alone will cause RSTEN to go active and activate SDL reset.

The actual setup-time of a tap to the clocking signal is given by:

$$tSU_{act,n} = TP - tDEL_n \qquad \text{(Equation 11)}$$

where $tSU_{act,n}$ is the actual steup-time of $TAP_n$ and $tDEL_n$ is given by equation 7.

By substituting equation 7 into equation 11, the following equation is obtained:

$$tSU_{act,n} = TP - \{[(n+1)/N]*TD\} MOD(TP). \qquad \text{(Equation 12)}$$

The setup-time margin is the difference between equations 12 and  and is given by:

$$tSU_{mgn,n} = (M+n+1)*TP/n - \{[(n+1)/N]*TD\} MOD(TP), M \leq n \leq N-M-1, \qquad \text{(Equation 13)}$$

wherein $tSU_{mgn,n}$ is the setup-time margin of the $n^{th}$ tap.

Equation 13 is illustrated for a 16-tap SDL in which the first and last three taps are not checked for polarity. The values of setup-time margin as fractions of TP for various values of TD, as given by equation 13, are tabulated in the table 77 of FIG. 13.

Referring to FIG. 13, from table 77, it is seen that in the fundamental mode, all of the taps have the same setup-time margin (0.19 TP in the example). In the subharmonic mode, however, where TD is greater than TP, the setup-time margin varies from tap to tap. Some of the taps even have a negative margin, implying insufficient setup-time. Nevertheless, as was noted previously, if only a single tap with polarity inversion with sufficient setup time is present, RSTEN will be sampled high by the clocking signal and reset will be activated. In the subharmonic examples in table 77, several inverted taps have sufficient setup-time margins, and, therefore, RSTEN will be sampled high in those cases and reset will be activated.

Referring to FIG. 14, a reset control circuit 80 is shown. The reset enable signal RSTEN is coupled as an input to a D-type flip-flop 82 and the reference clock CLK is coupled to the clock input of flip-flop 82. The output from flip-flop 82 is coupled to reset circuit, such as the reset circuit 66 of FIG. 5, which is comprised of inverter 67 and pass device 68.

It is to be appreciated that the reset scheme of the present invention is implemented with a SDL circuit such that no external reset input is required to the SDL integrated circuit. This results in the advantage that an external reset input pin is not required on the device. Further, another advantage is that the reset takes place during power up and not after the external reset input is deasserted. Thus, the SDL is in its stead-state as soon as power up is completed so that substantial amount of dead time to attain steady-state after external reset is deasserted is not required.

It is further appreciated that the reset scheme of the present invention is used with the dual phasing clock SDL 10a of FIG. 2, but other SDLs, such as SDL 10 of FIG. 1, and the quadrature clock scheme of the copending application can also be used without departing from the spirit and scope of the present invention.

Thus, a synchronous delay line with automatic reset is described.

I claim:

1. In an integrated circuit delay line apparatus which has a plurality of delay means coupled sequentially in order to generate at least one delayed signal synchronized with a reference signal input, an automatic reset circuit, comprising:
   detecting means coupled to at least some of said delay means to detect a polarity difference amount outputs from said delay means;
   reset means coupled to said detecting means for resetting said delay means if a polarity difference is detected among outputs from said delay means.

2. The automatic reset circuit of claim 1, wherein said detecting means is comprised of a plurality of gates serially arranged to to detect any polarity inversion.

3. In an integrated circuit delay line apparatus for generating at least one delayed signal synchronized with a reference signal, having a plurality of delay means, each for providing a controllable delay, each of said delay means coupled to receive a control signal for controlling the duration of said delays, the first of said delay means being coupled to receive said reference signal, each of the remaining said delay means being sequentially coupled to receive the delayed reference signal from the previous delay means, control signal generation means for generating said control signal, said control signal generation means coupled to receive said delayed reference signal from the last one of said sequentially coupled delay means, and tap means for tapping a signal from said delay means to provide said at least one delayed signal through use of said reference signal, an automatic reset circuit, comprising:
   detecting means coupled to at least some of said delay means to detect a polarity difference among outputs from said delay means;
   reset means coupled to said detecting means for resetting said delay means if a polarity difference is detected among outputs from said delay means.

4. The automatic reset circuit of claim 3, wherein said detecting means is comprised of a plurality of gates serially arranged to to detect any polarity inversion.

5. In an integrated circuit delay line apparatus for generating at least one delayed signal synchronized with a reference signal, having a plurality of delay means, each for providing a controllable delay, each of said delay means coupled to receive a control signal for controlling the duration of said delays, the first of said delay means being coupled to receive said reference signal, each of the remaining said delay means being sequentially coupled to receive the delayed reference signal from the previous delay means, control signal generation means for generating said control signal, said control signal generation means coupled to receive said delayed reference signal from the last one of said sequentially coupled delay means, and tap means for tapping a signal from said delay means to provide said at least one delayed signal through use of said reference signal, an automatic reset circuit internal to said integrated circuit, comprising:
   detecting means coupled to at least some of said delay means to detect a polarity difference among outputs from said delay means, said detecting means being comprised of a plurality of serially arranged NAND gates having one input terminal coupled to a corresponding tap output and a second input terminal coupled to outputs of a previous NAND gate, such that a polarity difference amount tap outputs coupled to said NAND gates causes a state change at the output of the last NAND gate;

reset means coupled to receive said last NAND gate output of said detecting means for resetting said delay means if said state change occurs, said resetting causing said delay line apparatus to reset to a fundamental mode of operation.

6. The automatic reset circuit of claim 5, wherein said polarity difference occurs if said delay line apparatus locks onto a subharmonic mode of operation.

7. The automatic reset circuit of claim 6, wherein said NAND gates includes an inverter at each of the NAND gate output terminals.

* * * * *

UNITED STATES PATENT AND TRADEMARK OFFICE
CERTIFICATE OF CORRECTION

PATENT NO. : 4,975,605

DATED : December 4, 1990

INVENTOR(S) : Mel Bazes

It is certified that error appears in the above-identified patent and that said Letters Patent is hereby corrected as shown below:

| | | |
|---|---|---|
| Col. 6, Line 42 | Delete "$SPH_2/$" | Insert -- $SPHI_1/$ -- |
| Col. 6, Line 44 | Delete "connected" | Insert --controlled-- |
| Col. 6, Line 52 | Delete "liming" | Insert --timing-- |
| Col. 9, Line 55 | Delete "PH" | Insert --PHI-- |
| Col. 9, Line 62 | Delete "invention" | Insert --inversion-- |
| Col. 10, Line 49 | Delete "$2N*TP<TD<2(N1)TP$" | |
| | Insert --$2N*TP<TD<2(N+1)TP$-- | |

Signed and Sealed this

Fifth Day of October, 1993

*Attest:*

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 4,975,605
DATED : December 4, 1990
INVENTOR(S) : Mel Bazes

It is certified that error appears in the above-indentified patent and that said Letters Patent is hereby corrected as shown below:

Col. 13, Line 19     After the first occurance of "and"   Insert --10--

Signed and Sealed this

Twenty-seventh Day of September, 1994

Attest:

BRUCE LEHMAN

Attesting Officer          Commissioner of Patents and Trademarks